United States Patent
Nishio et al.

(10) Patent No.: US 10,563,933 B2
(45) Date of Patent: Feb. 18, 2020

(54) HEAT RADIATION MEMBER AND METHOD FOR MANUFACTURING THE SAME

(71) Applicants: Kazuaki Nishio, Nisshin (JP); Kenji Shimoda, Nagoya (JP)

(72) Inventors: Kazuaki Nishio, Nisshin (JP); Kenji Shimoda, Nagoya (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 505 days.

(21) Appl. No.: 14/646,931

(22) PCT Filed: Jan. 8, 2014

(86) PCT No.: PCT/IB2014/000010
§ 371 (c)(1),
(2) Date: May 22, 2015

(87) PCT Pub. No.: WO2014/118609
PCT Pub. Date: Aug. 7, 2014

(65) Prior Publication Data
US 2015/0315699 A1    Nov. 5, 2015

(30) Foreign Application Priority Data

Jan. 29, 2013   (JP) ................. 2013-014600

(51) Int. Cl.
*C23C 4/01* (2016.01)
*C23C 4/06* (2016.01)
(Continued)

(52) U.S. Cl.
CPC .............. *F28F 13/185* (2013.01); *C23C 4/01* (2016.01); *C23C 4/04* (2013.01); *C23C 4/06* (2013.01);
(Continued)

(58) Field of Classification Search
CPC .... C23C 4/01; C23C 4/06; C23C 4/08; C23C 4/18; C23C 4/11; C23C 4/10;
(Continued)

(56) References Cited

U.S. PATENT DOCUMENTS 5,356,724 A * 10/1994 Tsuda ................. C23C 8/10
428/472.2
6,468,669 B1 * 10/2002 Hasz .................. B32B 15/01
428/553
(Continued)

FOREIGN PATENT DOCUMENTS

| EP | 1288341 A1 | 3/2003 |
| JP | 08-206241 A | 8/1996 |

(Continued)

OTHER PUBLICATIONS

Ghali, Edward. 2010. Corrosion resistance of aluminum and magnesium alloys. [electronic resource] : understanding, performance, and testing. n.p.: Hoboken, N.J. : John Wiley, 2010., 2010 (Year: 2010).*

(Continued)

*Primary Examiner* — Jose Hernandez-Diaz
(74) *Attorney, Agent, or Firm* — Sughrue Mion, PLLC

(57) ABSTRACT

A heat radiation member includes a metal base material made of a first metal material; and a plurality of heat radiation sections that are separately attached so as to disperse on a surface of the metal base material and contains a second metal material that is different from the first metal material and an oxide of the second metal material exposed on a surface of each of the respective heat radiation sections.

2 Claims, 9 Drawing Sheets

(51) Int. Cl.
*C23C 4/18* (2006.01)
*F28F 13/18* (2006.01)
*C23C 4/08* (2016.01)
*C23C 14/16* (2006.01)
*C23C 14/32* (2006.01)
*C23C 14/58* (2006.01)
*C23C 4/04* (2006.01)

(52) U.S. Cl.
CPC .................. *C23C 4/08* (2013.01); *C23C 4/18* (2013.01); *C23C 14/16* (2013.01); *C23C 14/325* (2013.01); *C23C 14/5853* (2013.01)

(58) Field of Classification Search
CPC ....... C23C 4/134; C23C 14/16; C23C 14/325; C23C 14/5853; F28F 13/185; C22C 22/00; C22C 21/00
See application file for complete search history.

(56) References Cited

U.S. PATENT DOCUMENTS

| | | | |
|---|---|---|---|
| 7,276,293 B1 | 10/2007 | Saruwatari et al. | |
| 2002/0106457 A1* | 8/2002 | Lee | C23C 14/042 427/404 |
| 2004/0166355 A1* | 8/2004 | Lee | C23C 4/02 428/553 |
| 2005/0123686 A1* | 6/2005 | Myrick | C23C 4/06 427/446 |
| 2008/0023179 A1* | 1/2008 | Bunker | F28F 13/185 165/109.1 |
| 2010/0180799 A1 | 7/2010 | Saiki | |
| 2015/0197858 A1* | 7/2015 | Corbeil | C23C 24/04 427/448 |

FOREIGN PATENT DOCUMENTS

| | | |
|---|---|---|
| JP | 2001152317 A | 6/2001 |
| JP | 2004-043612 A | 2/2004 |
| JP | 2005-344139 A | 12/2005 |
| JP | 2009-099287 A | 5/2009 |
| JP | 2010-168998 A | 8/2010 |

OTHER PUBLICATIONS

Flege et al. Self-limited oxide formation in Ni(111) oxidation. Retrieved from https://arxiv.org/pdf/1104.3481.pdf (Year: 2012).*

"On". Merriam Webster online dictionary, retrieved on Mar. 28, 2019 from https://www.merriam-webster.com/dictionary/on. (Year: 2019).*

* cited by examiner

HEAT RADIATION MEMBER AND METHOD FOR MANUFACTURING THE SAME

BACKGROUND OF THE INVENTION

1. Field of the Invention

The invention relates to a heat radiation member and a method for manufacturing the same.

2. Description of Related Art

A technique in which, in order to efficiently radiate heat transmitted to a base material to the outside, irregularities are formed or high reflectance inorganic particles are disposed to a shape of a surface of the base material is known. For example, when the inorganic particles are disposed, a coat is formed on a surface of the base material, and the inorganic particles are dispersed in the coat.

As such a technique, heat radiation members such as shown below have been proposed. For example, in Japanese Patent Application Publication No. 2010-168998 (JP 2010-168998 A), a heat radiation member that includes a base material made of stainless, a nickel alloy or the like and a heat radiation coat coated on a surface of the base material is proposed. In the heat radiation coat that constitutes the heat radiation member, with an inorganic binder such as a glass binder or the like as a binder, inorganic particles constituted of an oxide made of at least one kind of manganese, iron, copper, cobalt and chromium are dispersed.

Further, as another technique, in Japanese Patent Application Publication No. 2004-43612 (JP 2004-43612 A), a heat radiation member in which a heat radiation coat is formed on a surface of a base material such as aluminum or the like is proposed. In the heat radiation coat that constitutes the heat radiation member, with a polymer resin as a binder, inorganic particles of an oxide of tin and, antimony are dispersed.

According to these techniques, inorganic particles made of a material (oxide) having reflectance higher than that of a material of the base material are dispersed in the heat radiation coat coated on a surface of the base material; therefore, heat transmitted to the base material can efficiently be radiated to the outside.

However, the heat radiation member described in JP 2010-168998 A uses a glass binder as an inorganic binder. Therefore, during deposition, a temperature of the glass softening temperature or more has to be used to deposit a heat radiation coat. As a result, when a metal material such as aluminum and the like having a melting point lower than the glass softening temperature for the base material, the base material may be melted. Further, when the heat radiation member is used in a temperature range of a temperature of the glass softening temperature or more, the heat radiation coat itself may deform due to softening of the glass binder.

On the other hand, the heat radiation member described in JP 2004-43612 A uses a polymer resin as the binder. However, during use of the heat radiation member, the polymer resin may degrade. Furthermore, due to thermal expansion difference between the polymer resin as the binder and a metal such as aluminum or the like that constitutes the base material, it is likely that thermal stress is generated in an interface of the base material and the heat radiation coat, and the heat radiation coat is peeled.

SUMMARY OF THE INVENTION

The present invention provides a heat radiation member that can be manufactured for a broad range of metallic base materials and secure reliability and endurance in a broad temperature region, and a method for manufacturing the same.

A heat radiation member according to a first aspect of the present invention includes: a metal base material made of a first metal material; and a plurality of heat radiation sections that are separately attached so as to disperse on a surface of the metal base material and contain a second metal material that is different from the first metal material and an oxide of the second metal material exposed on a surface of each of the respective heat radiation sections.

According to the aspect described above, since heat radiation sections contributing to heat radiation are separately attached so as to disperse on a surface of a metal base material made of the first metal material, thermal stress due to difference in linear expansion coefficients of a metal that constitutes the metal base material and a metal that constitutes the heat radiation section can be reduced.

That is, in the case where a continuous coat is formed on a surface of the metal base material, thermal expansion difference between the metal base material and the coat as a whole acts as a thermal stress to an interface thereof. However, according to the aspect described above, differently from the coat, since a plurality of heat radiation sections separately attached on a surface of the metal base material so as to disperse are disposed, the heat radiation section has a structure where the coat is separated in plural in plane. As a result, the thermal expansion difference between the metal base material and each of the heat radiation sections is smaller in comparison with the case where the coat is disposed. Thermal stress generated in an interface between the metal base material and each of the heat radiation sections can be reduced. Thus, in a broad temperature range, reliability and endurance of the heat radiation member can be secured.

Further, a metal oxide has emissivity higher than that of a metal non-oxide. Therefore, due to an oxide of the second metal material exposed on a surface of each of heat radiation sections, from a surface of the heat radiation section, heat inputted to the metal base material can efficiently be radiated (heat radiation) to the outside.

In the above aspect, the second metal material of each of the heat radiation sections may be made of a plurality of kinds of metals. One heat radiation section includes a plurality of kinds of metals, and oxides obtained by oxidizing the plurality of kinds of metals are exposed from the heat radiation section. As a result, the heat radiation section has high emissivity over a broad wavelength region compared with the case where one kind of metal material is used.

In the above aspect, the second metal material of each of the respective heat radiation sections may be formed of a metal mainly made of a single metal material and the plurality of heat radiation sections may contain a plurality of kinds of the single metal materials. According to the aspect, in comparison with the case where one kind of metal material is used, high emissivity can be obtained in a broad wavelength region.

In the above aspect, the first metal material is an aluminum-based material or stainless steel, and the second metal material may be a metal material mainly made of manganese.

According to the aspect, manganese basically has high emissivity, and also in a temperature region (200° C. to 300° C.) where an aluminum-based material is mainly used, has excellent emissivity. When the aluminum-based material or stainless steel is used as the first metal material, the materials used in the invention can be applied to sites where heat dissipation properties are required such as an engine of a vehicle, a motor casing and the like.

A method for manufacturing a heat radiation member according to a second aspect of the invention includes disposing a mesh on a metal base material made of a first metal material; and forming a heat radiation section made of granulated particles on a surface of the metal base material by spraying granulated particles granulated from particles made of a second metal material different from the first metal material and particles made of an oxide thereof on a surface of the metal base material provided with the mesh.

According to the above aspect, since granulated particles made of the second metal material and an oxide thereof are sprayed through a mesh on a surface of the metal base material, a plurality of heat radiation sections that are separated so as to disperse on a surface of the metal base material can be attached on a surface of the metal base material. Further, each of attached heat radiation sections contains an oxide obtained by oxidizing the second metal material, and on a surface of each of the heat radiation sections, an oxide obtained by oxidizing the second metal material can be exposed as a heat radiation material.

A method for manufacturing a heat radiation member according to a third aspect of the invention includes disposing a mesh on a metal base material made of a first metal material; spraying metal particles made of a second metal material different from the first metal material on a surface of a metal base material provided with the mesh; and forming a heat radiation section where a surface of the sprayed metal particles is oxidized on a surface of the metal base material by oxidizing the sprayed metal particles.

According to the invention, since the metal particles made of the second metal material are sprayed through the mesh on a surface of the metal base material, a plurality of metal particle groups that are separated so as to disperse on a surface of the metal base material can be attached on a surface of the metal base material. Further, since each of attached particle groups is oxidized, an oxide layer in which the second metal material is oxidized in a superficial layer can be formed on a superficial layer of the heat radiation section as a heat radiation material.

A method for manufacturing a heat radiation member according to a fourth aspect of the invention includes attaching metal particles discharged from a target made of a second metal material different from a first metal material by applying a bias voltage to a metal base material made of a first metal material to a surface of the metal base material so as to disperse on a surface of the metal base material; and forming a heat radiation section in which a surface of the attached metal particles is oxidized on a surface of the metal base material by oxidizing attached metal particles.

According to the above aspect, metal particles made of the second metal material are attached on a surface of the metal base material. Therefore, a plurality of metal particle groups that are separated so as to disperse on a surface of the metal base material can readily be attached on a surface of the metal base material. Further, each of the attached metal particle groups is oxidized. Therefore, an oxide layer in which the second metal material is oxidized in a superficial layer can be formed on a superficial layer of the heat radiation section as a heat radiation material.

According to the above aspect, the heat radiation member can be manufactured for a broad range of metal base materials and can secure reliability and endurance in a broad temperature range.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, a heat radiation member according to an embodiment of the invention and a method for manufacturing the same will be described.

<Heat Radiation Member>

Figure 1A:
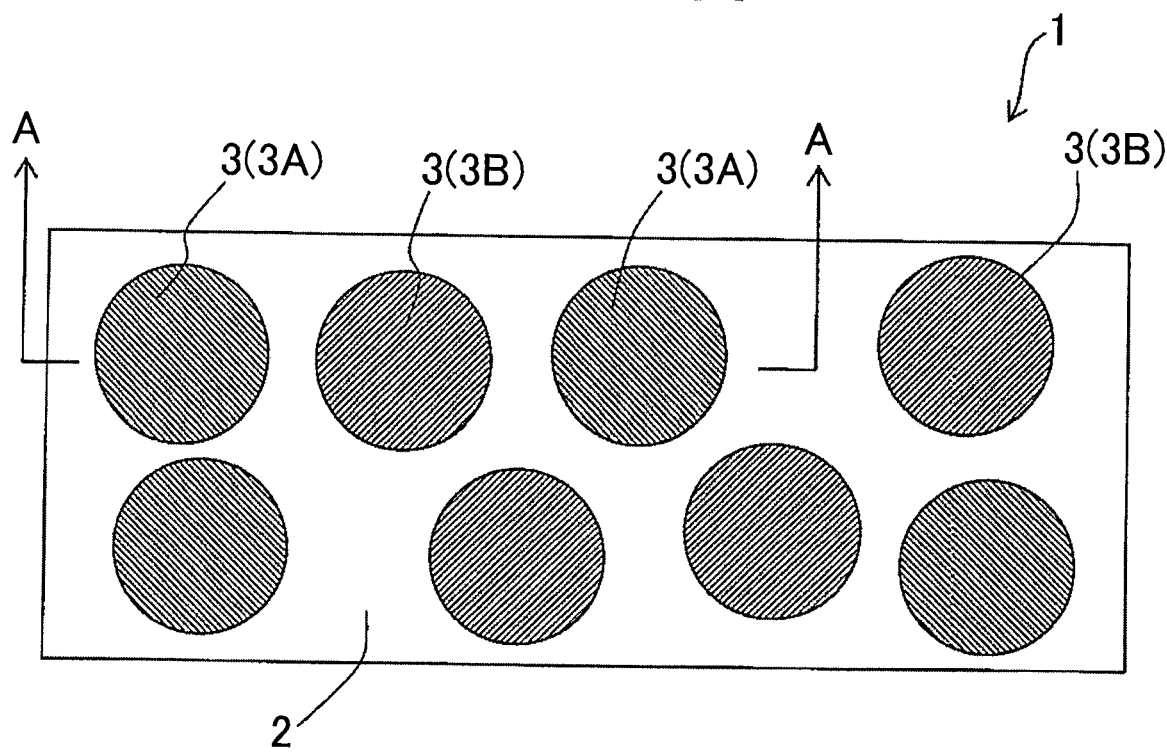
FIG. 1A is a top diagram that shows a schematic conceptual diagram of a heat radiation member according to an embodiment of the invention.
Figure 1B:
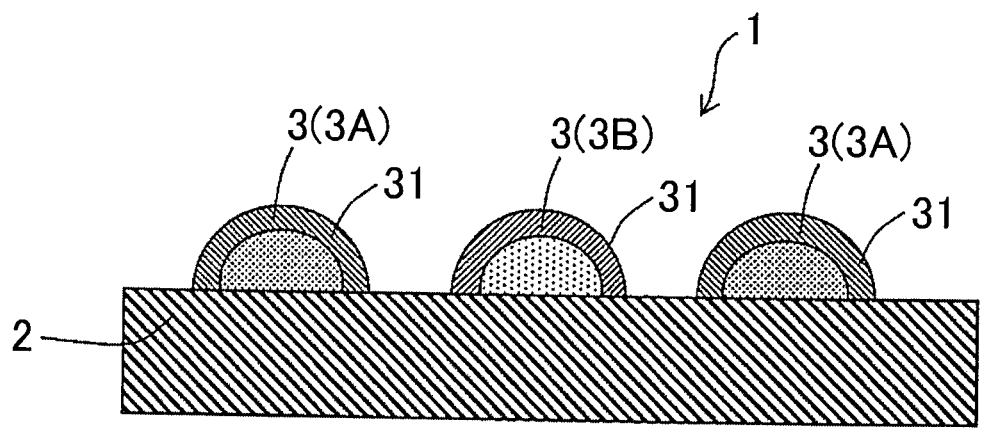
FIG. 1B is a cross-sectional diagram along an A-A line arrow mark of FIG. 1A.

FIG. 1A and FIG. 1B are schematic conceptual diagrams that show a heat radiation member according to an embodiment of the invention, FIG. 1A is a top view, and FIG. 1B is a cross-sectional diagram along an A-A line arrow mark of FIG. 1A.

As shown in FIG. 1A and FIG. 1B, a heat radiation member (infrared radiation member) 1 according to an embodiment is a member for efficiently radiating heat inputted to a metal base material 2 from a surface to the outside. The heat radiation member 1 according to the embodiment includes a metal base material 2 made of a first metal material and a plurality of heat radiation sections 3 that are separately attached so as to disperse on a surface of the metal base material 2 and contain a second metal material different from the first metal material. Herein, on a surface of each of the heat radiation sections 3, an oxide obtained by oxidizing the second metal material is exposed. According to the embodiment, an oxide layer 31 formed by oxidizing the second metal material is formed, and according to the oxide layer 31 heat radiation properties can be improved.

The oxide obtained by oxidizing the second metal material preferably has reflectance higher than those of the first metal material, its oxide and the second metal material, that is, reflectance of 70% or more. Further, a thickness of the heat radiation section is preferably 1 μm or more. Therefore, heat inputted to the metal base material 2 can more preferably be radiated from the oxide obtained by oxidizing the second metal material. According to the embodiment, over an entire surface of the heat radiation section 3, the oxide obtained by oxidizing the second metal material is exposed. However, it is not necessarily required to form the oxide layer 31 for improving the heat radiation (infrared radiation). That is, the oxide may partially be exposed with respect to a surface of the heat radiation section 3, and it is preferable that the oxide layer of 50% or more with respect to a surface area of the heat radiation section 3 is exposed.

Further, a contact area through which the heat radiation section 3 comes into contact with the metal base material 2 is preferably 1 mm$^2$ or less. Thus, as described below, adhesiveness of the heat radiation section 3 to the metal base material 2 can be secured. This point will be described below together with FIG. 2 and FIG. 3.

Herein, the first metal material that constitutes the metal base material 2 is made of an aluminum-based material such as aluminum or aluminum alloys, or a metal material such as stainless steel. The second metal material that constitutes the heat radiation section contain at least one kind selected from the group consisting of manganese, iron, chromium, copper, titanium, aluminum, silicon, calcium, add magnesium as a main component. Herein, the second metal material may be formed of a single and same metal material.

However, as a more preferable mode, the second metal material of the heat radiation section 3 according to the embodiment is formed of a metal mainly made of a single metal material, and a plurality of heat radiation sections 3 have two or more kinds of single metal materials. Specifically, as shown in FIG. 1, the case of the present embodiment has two kinds of single metal materials, for example, among the heat radiation sections 3, the second metal material according to a first heat radiation section 3A is a metal material mainly made of manganese, and the second metal material according to a second heat radiation section 3B is a metal mainly made of the metal other than manganese.

According to the heat radiation member 1 in such a configuration, since the heat radiation sections 3 that contribute to heat radiation are separately attached so as to disperse on a surface of the metal base material 2 made of the first metal material, thermal stress due to difference in linear expansion coefficients between the metal that constitutes the metal base material 2 and the metal that constitutes the heat radiation section 3 can be reduced.

That is, while, in the case where a continuous coat is formed on a surface of the metal base material, thermal expansion difference between the metal base material and a whole coat works as a thermal stress on an interface thereof, in the present embodiment, differently from the coat, a plurality of heat radiation sections 3 that are separately attached on a surface of the metal base material so as to disperse are disposed, the heat radiation sections 3 become an island-like structure where the coat is cut in plural in plane. As a result like this, each of the heat radiation sections 3 independently thermally expands and thermally contracts. Therefore, the thermal expansion difference between the metal base material 2 and each of the heat radiation sections 3 becomes smaller than the case where the coat is disposed, and the thermal stress generated in an interface between the metal base material 2 and each of the heat radiation sections 3 can be reduced. Thus, reliability and endurance of the heat radiation member 1 can be secured in a broad temperature range.

Furthermore, since a metal oxide has emissivity (thermal conductivity) larger than that of a metal that is a non-oxide, from a surface of a heat radiation section, due to an oxide of the second metal material exposed on a surface of each of the heat radiation sections, heat inputted to the metal base material can efficiently be radiated (thermal radiation) through the heat radiation section to the outside.

In particular, since the plurality of heat radiation sections 3 according to the embodiment have two or more kinds of single metal materials, the heat radiation sections 3 have high emissivity in a broader wavelength region (infrared ray wavelength region) compared with the case where one kind of metal material is used. Further, as another aspect, the second metal material of each of the heat radiation sections may contain a plurality of kinds of the second metal materials (for example, containing manganese and other metal). Also in this case, similarly, the heat radiation section has higher emissivity in a broad wavelength region than the case where one kind of metal material is used.

Figure 2:
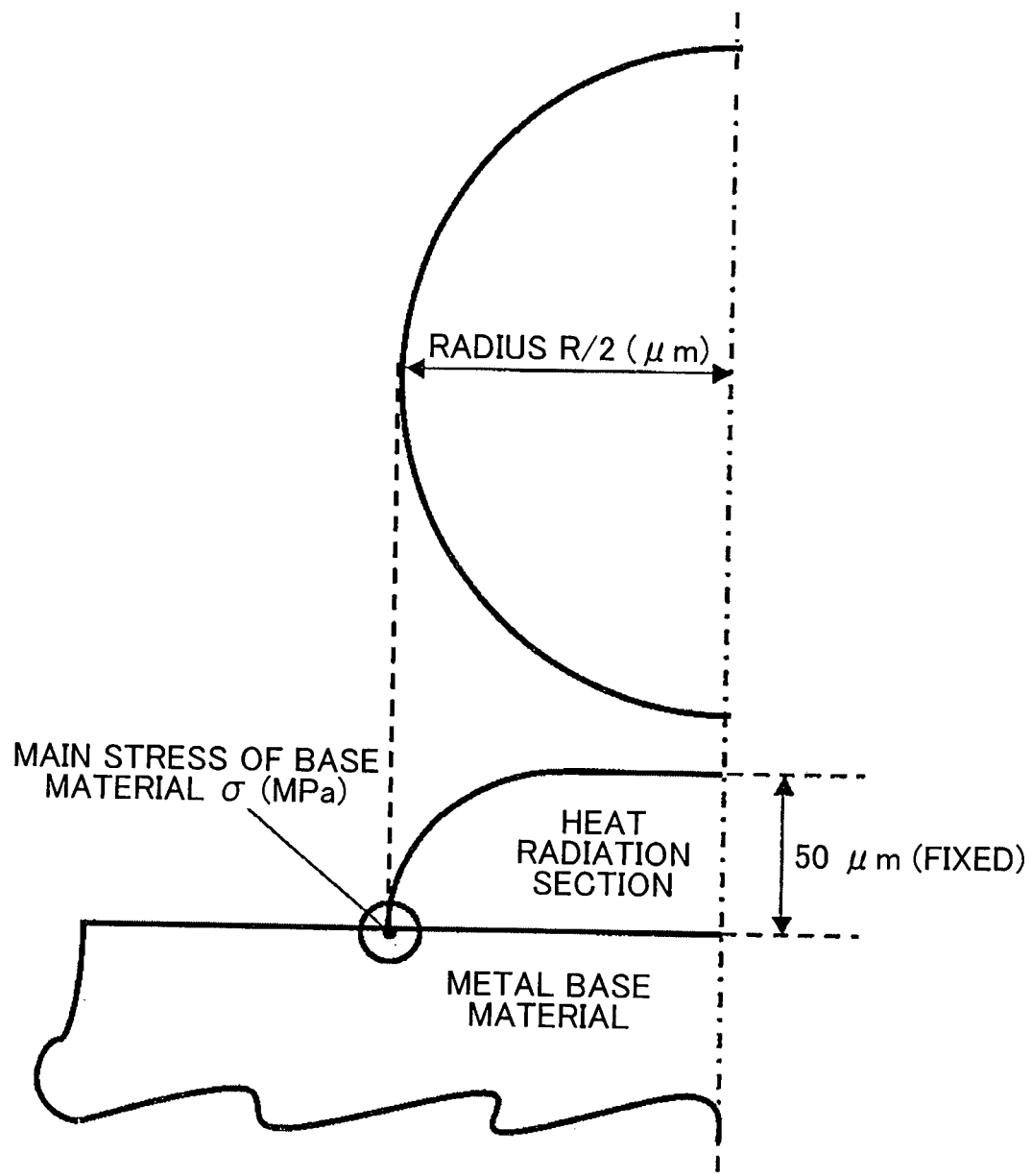
FIG. 2 is a diagram that shows an analysis model of a heat radiation member according to the embodiment of the invention.
Figure 3:
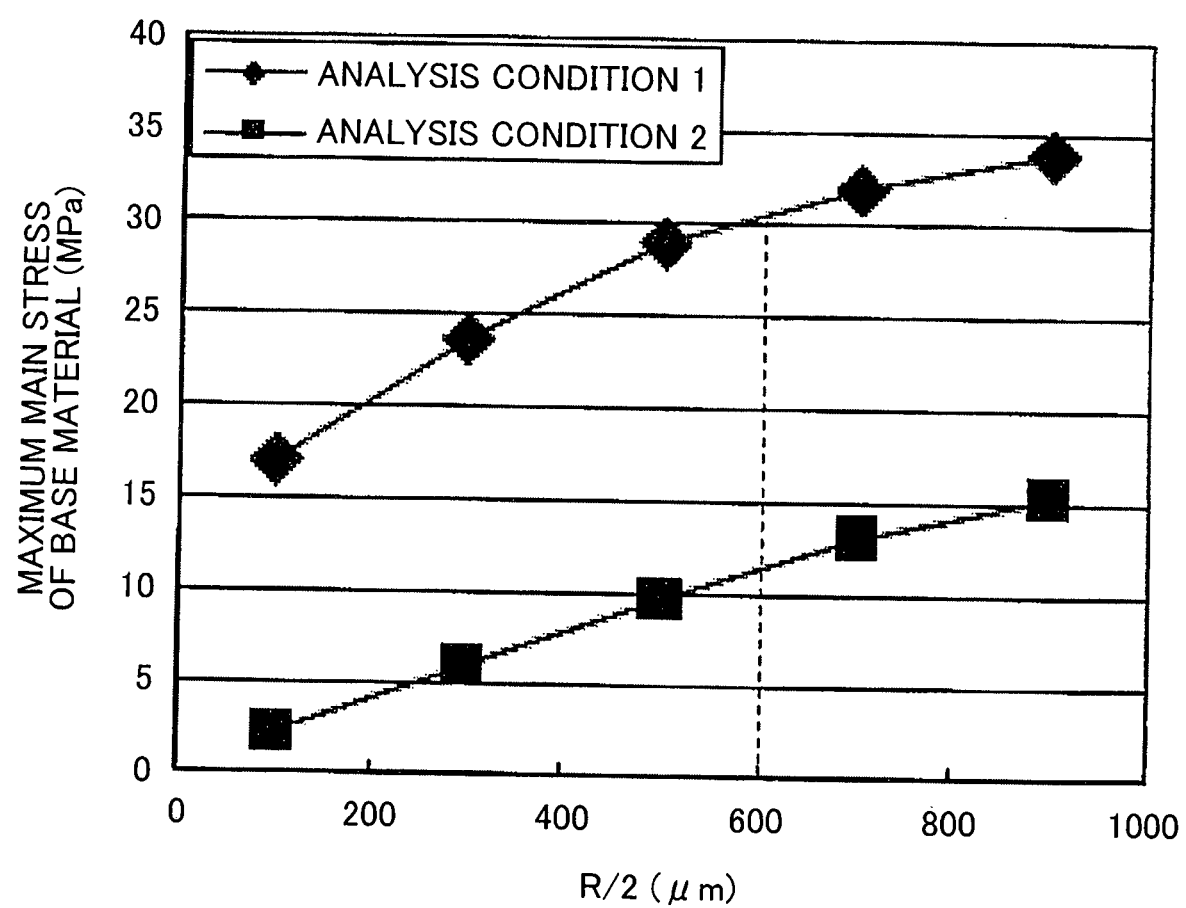
FIG. 3 is a diagram that shows an analysis result obtained by using the analysis model of FIG. 2.

The inventors performed stress analysis using an analysis model shown in FIG. 2 with physical property values shown in the following Table 1 as a premise. FIG. 2 is a diagram that shows an analysis model of a heat radiation member according to the embodiment of the invention, and FIG. 3 is a diagram that shows analysis results obtained using the analysis model of FIG. 2.

The analysis model shown in FIG. 2 is a model where a state in which a substantially disc-like heat radiation section is attached to a metal base material is supposed, and an analysis condition 1 supposed a metal base material made of stainless steel (JIS Standard: SUS 425) as the first metal material, and an analysis condition 2 as the first metal material supposed a metal base material made of aluminum alloy (JIS Standard: AC2C) as the first metal material. Further, as the heat radiation section, manganese was supposed.

A main stress acting on the metal base material was analyzed by varying a radius of the heat radiation section of a portion where the heat radiation section came into contact with the metal base material. Results are shown in FIG. 3. Incidentally, in the case of general spraying, an interface adhesion strength (base material main stress) due to anchor effect is 30 MPa or less. When a structure of the heat radiation section of the embodiment is adopted, a radius of the heat radiation section is preferably 600 μm or less, and a contact area with which the heat radiation section 3 comes into contact with the metal base material 2 is preferably 1 mm$^2$ or less.

TABLE 1

| Analysis condition | Temperature (K) | Physical properties of heat radiation section | | | Physical properties of base material | | |
|---|---|---|---|---|---|---|---|
| | | Supposed material | Linear expansion coefficient (×10⁻⁵/K) | Young's modulus (GPa) | Supposed material | Linear expansion coefficient (×10⁻⁵/K) | Young's modulus (GPa) |
| 1 | 1123 | Mn | 21.6 (298 K) | 198 (298 K) | SUS 425 | 12 (1123 K) | 210 (1123 K) |
| 2 | 523 | Mn | 21.6 (298 K) | 198 (298 K) | AC2C | 24 (523 K) | 60 (523 K) |

From the viewpoint like this, a preferable method for manufacturing a heat radiation section will be described below.

<First Manufacturing Method>

Figure 4:
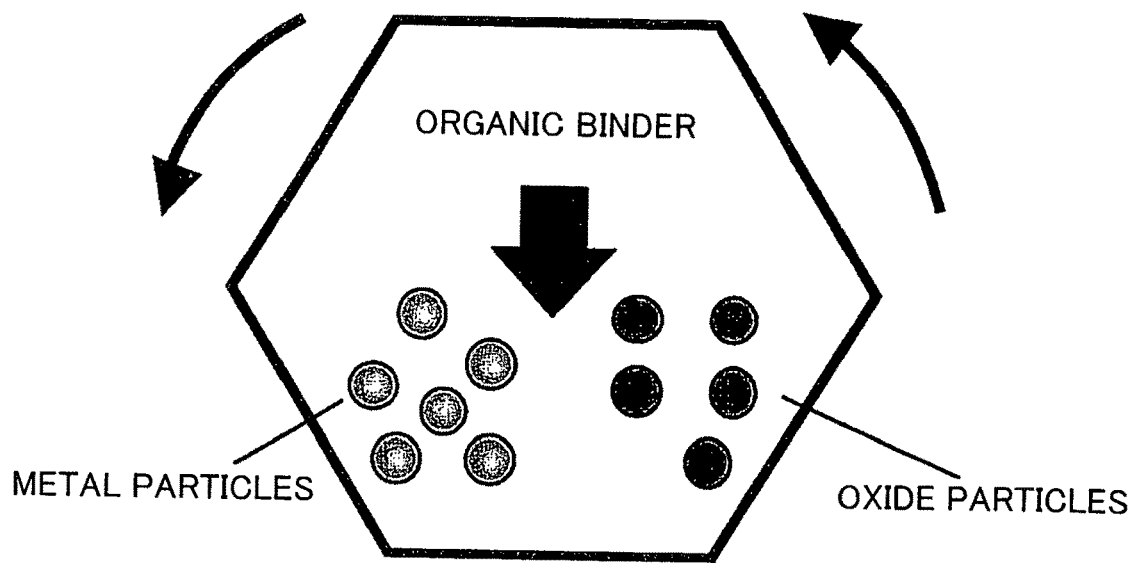
FIG. 4 is a schematic diagram that illustrates a method for manufacturing granulated particles according to Example 1 of the invention.

According to a first method for manufacturing, granulated particles obtained by granulating particles made of the second metal material and particles made of the oxide thereof are first manufactured. Specifically, as shown in FIG. 4, metal particles M and particles made of its oxide (M oxide) are granulated by kneading granulation method using an organic binder.

Figure 5:
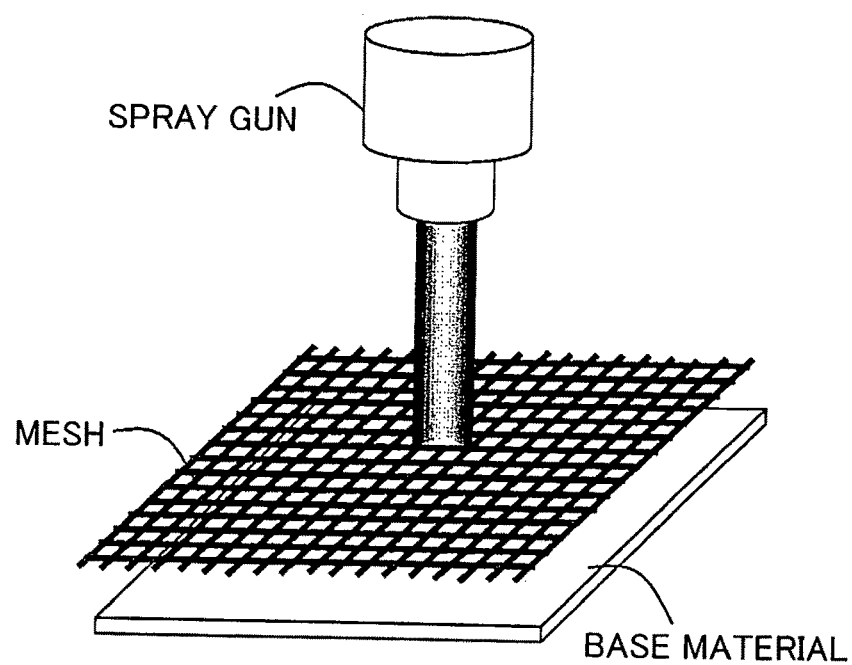
FIG. 5 is a schematic diagram for illustrating a manufacturing apparatus according to first and second manufacturing methods of the invention.

Next, as shown in FIG. 5, on the metal base material, in a contact state or non-contact state, a mesh is placed. On a surface of the metal base material on which the mesh is placed, by spraying granulated particles, a heat radiation section made of granulated particles is formed on a surface of the metal base material.

The heat radiation section obtained as described above is obtained by spraying the granulated particles through the mesh on a surface of the metal base material. Therefore, a plurality of heat radiation sections that are separated so as to disperse on a surface of the metal base material can be attached on a surface of the metal base material. Further, each of the attached heat radiation sections contains an oxide obtained by oxidizing the second metal material, and, on a surface of each of the heat radiation sections, an oxide obtained by oxidizing the second metal material can be exposed.

<Second Manufacturing Method>

According to, the second manufacturing method, as shown in FIG. 5, a mesh is placed on the metal base material in contact or non-contact state. Next, on a surface of the metal base material on which the mesh is placed, metal particles made of the second metal material different from the first metal material are sprayed. Thus, a plurality of metal particle groups that are separated so as to disperse on a surface of the metal base material can be attached to a surface of the metal base material.

Further, by oxidizing sprayed metal particles (metal particle groups), a heat radiation section in which, a surface of the sprayed metal particles (metal particle groups) is oxidized is formed on a surface of the metal base material. As a result like this, since each of attached metal particle groups is oxidized, an oxide layer in which in a surface layer the second metal material is oxidized can be formed on a superficial layer of the heat radiation section as a radiation material.

<Third Manufacturing Method>

According to a third manufacturing method, as shown in FIG. 6, a heat radiation member is manufactured by using a deposition device by arc ion plating (AIP). Specifically, first, the metal base material made of the first metal material and a target (cathode) made of the second metal are arranged in the deposition device. In this case, a plurality of targets made of different metals may be arranged.

Then, in the deposition device, a carrier gas such as nitrogen or the like is introduced, and when a bias voltage is applied to the metal base material, a voltage is applied between an anode and a cathode to cause arc discharge. The arc is irradiated on the target, the target discharges metal particles, and the discharged metal particles are attached so as to disperse on a surface of the metal base material.

Thus, since metal particles made of the second metal material are attached on a surface of the metal base material, a plurality of metal particle groups that are separated so as to disperse on a surface of the metal base material can readily be attached on a surface of the metal base material.

Further, by oxidizing attached metal particles (metal particle groups), a heat radiation section in which a surface of the attached metal particles (metal particle groups) is oxidized is formed on a surface of the metal base material. As a result like this, since each of attached metal particle groups is oxidized, an oxide layer in which the second metal material is oxidized in a superficial layer can be formed in a superficial layer of the heat radiation section as a radiation material. Incidentally, according to the third manufacturing method, the heat radiation member is manufactured using arc ion plating. However, by using a sputtering method, the heat radiation member may be manufactured.

Figure 7A:
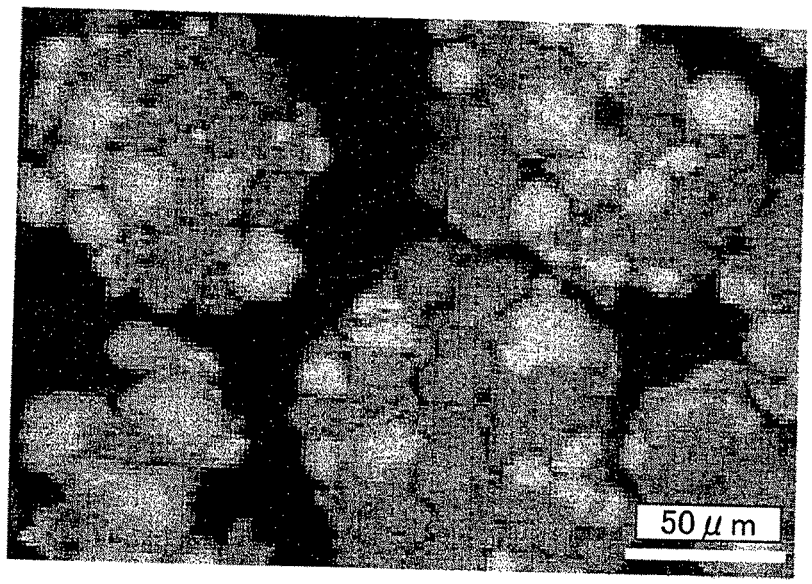
FIG. 7A is a photograph of, a granulated powder manufactured according to a method for manufacturing a heat radiation member according to Example 1 of the invention.

Hereinafter, the present embodiment will be described with reference to examples. (Example 1) According to the above-described first manufacturing method, a heat radiation member was prepared. Specifically, to ferromanganese (metal M) shown in the following Table 2 and having an average particle size of 27.2 μm, 25% by mass of oxide (M oxide) that was generated when ferromanganese shown in the following Table 3 and having an average particle size of 27.3 μm was manufactured, and 2% by mass of pasty polyvinyl alcohol obtained by dissolving in water as an organic binder were mixed and, by kneading granulating method, granulated particles having a average particle size of 76.9 μm were prepared. An electron micrograph of the granulated particles is shown in FIG. 7A.

TABLE 2

| Mn | C | Si | P | S |
|---|---|---|---|---|
| 73 to 78% by mass | ≤7% by mass | ≤1% by mass | ≤0.2% by mass | ≤0.02% by mass |

TABLE 3

| $MnO_2$ | $Fe_2O_3$ | $SiO_2$ | CaO | MgO | $Al_2O_3$ |
|---|---|---|---|---|---|
| 67 to 71% by mass | ≤1 to 3% by mass | ≤1% by mass | ≤0.1% by mass | ≤1% by mass | ≤0.3% by mass |

Next, on a metal base material (JIS: SUS 444: 40 mm×40 mm, thickness: 2 mm) of which surface was roughened by shot blasting, a mesh (JIS Standard: SUS 304: ϕ 0.25×100× 100 mm, 30 mesh/inch) was fixed. Thereon, the granulated powder was attached so that a film thickness was 100 μm by plasma spraying (condition: current value 450 A, argon gas flow rate 30 L/minute, hydrogen flow rate 5 L/minute, spraying distance 150 mm). Thereafter, the mesh was removed from the metal base material, and a heat radiation member was prepared.

Comparative Example

Figure 6A:
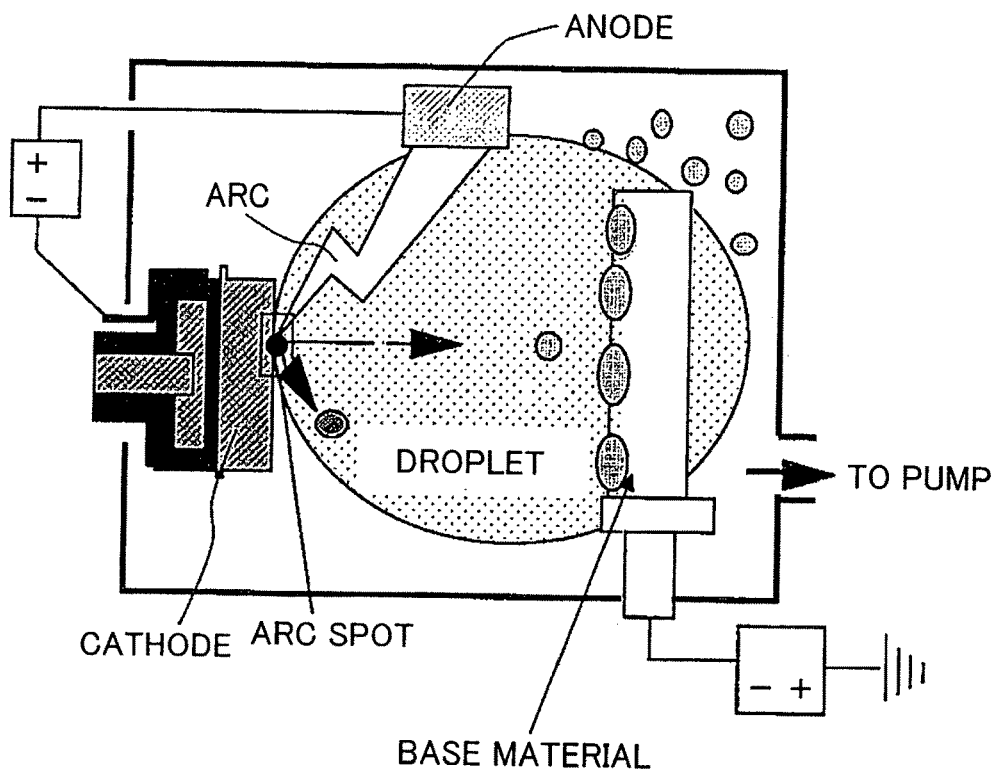
FIG. 6A is a view of a whole apparatus illustrated by a schematic view for describing a manufacturing apparatus according to a third manufacturing method of the invention.
Figure 6B:
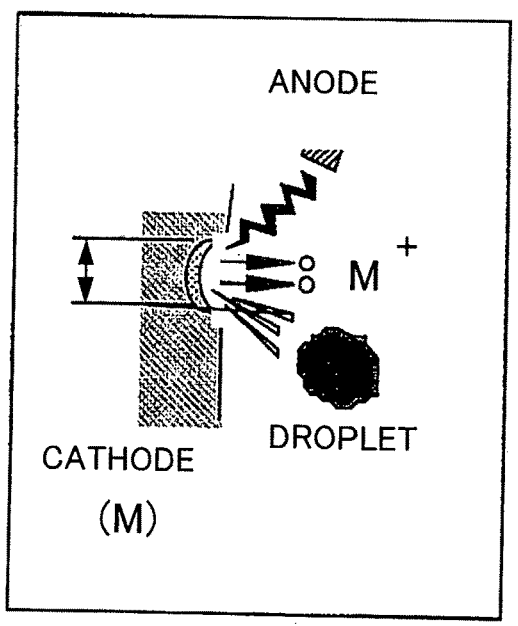
FIG. 6B is a diagram that shows the vicinity of an arc spot shown in FIG. 6A.
Figure 7B:
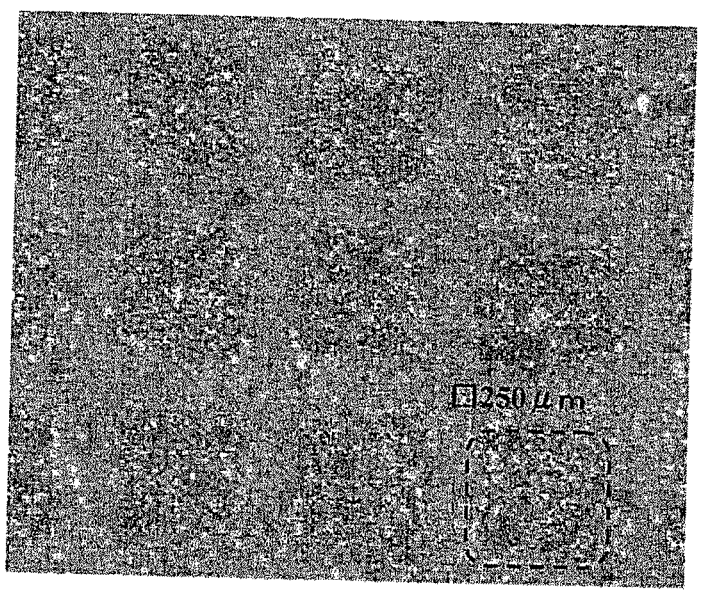
FIG. 7B is a photograph that shows a, surface of the heat radiation member according to Example 1 of the invention.
Figure 7C:
FIG. 7C is a photograph of a cross section of the heat radiation member according to Example 1 of the invention.
Figure 8A:
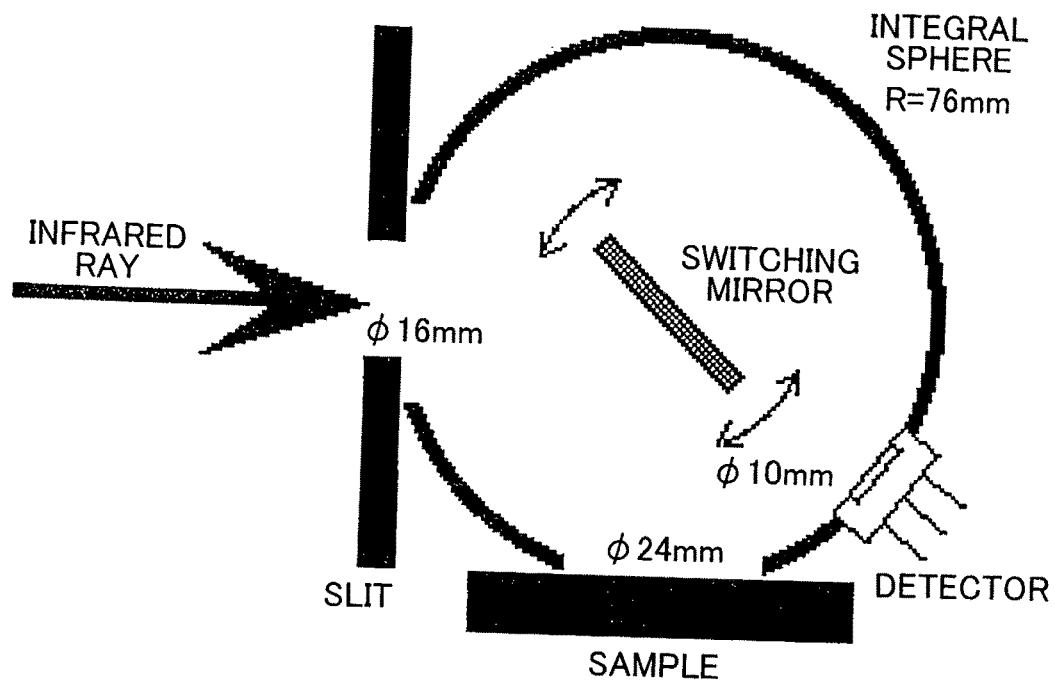
FIG. 8A is a schematic diagram for illustrating a method for measuring emissivity.
Figure 8B:
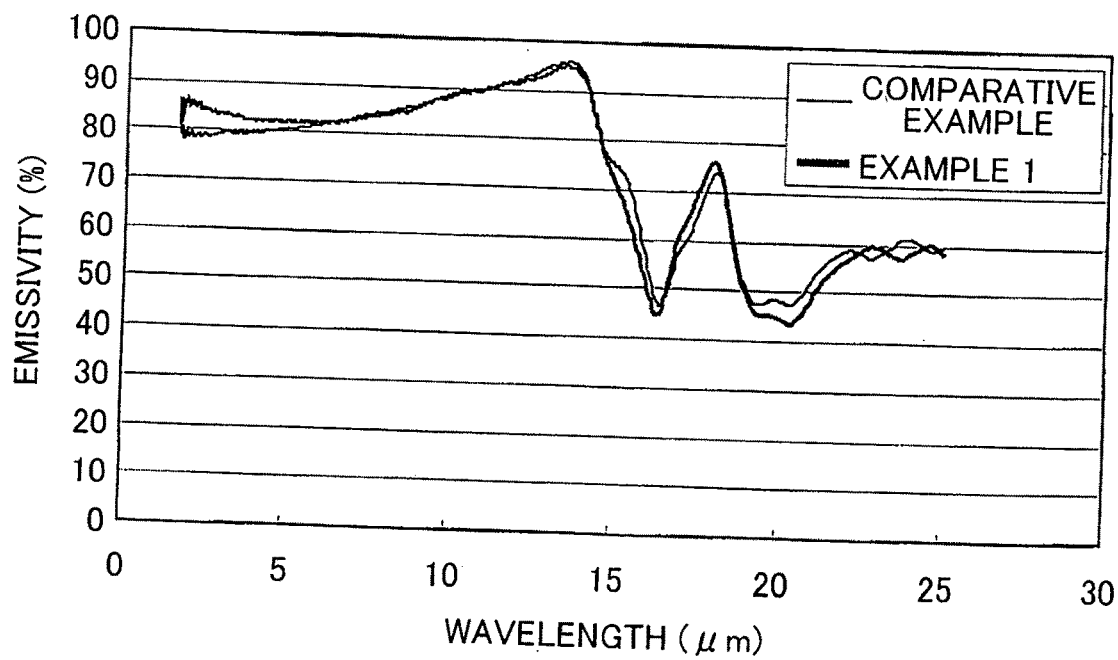
FIG. 8B is a diagram that shows measurement results of emissivity of Example 1 and Comparative Example.

In the same manner as that of example 1, a heat radiation member was prepared. A point different from example 1 was in that without disposing the mesh on the metal base material, the granulated powder was attached, such that a film thickness was 100 μm or less by plasma spraying.
<Electron Micrograph Observation>
A surface and a cross-section of the heat radiation member according to example 1 were observed with a microscope. Results thereof are shown in FIGS. 7B and 7C. FIG. 7B is a photograph of a surface of the heat radiation member according to example 1, and FIG. 7C is a sectional photograph of the heat radiation member according to example 1.
<Measurement of Infrared Emissivity>
Infrared emissivity of each of the heat radiation members according to example 1 and comparative example was measured according to an "indirect measurement method that uses an integrating sphere due to FT-IR" in accordance with JIS R 1801. Specifically, as shown in FIG. 6A, at an opening having a diameter of 24 mm of an integrating sphere having a radius of 76 mm, a heat radiation member was placed as a sample. Then, a disc-like switching mirror having a diameter of 10 mm was rotated, infrared ray was illuminated from a slit having a diameter of 16 mm, and infrared emissivity of the heat radiation member was measured from infrared ray detected by a detector. Results thereof are shown in FIG. 6B.
<Results>
As shown in FIGS. 7B and 7C, in the heat radiation member according to example 1, a plurality of heat radiation sections made of ferromanganese and oxide thereof were separately attached on a surface of the metal base material while dispersing on a surface of the metal base material. Further, as shown in FIG. 8B, the heat radiation member according to example 1 has the emissivity the same as that of comparative example in spite of low rate of ferromanganese and the oxide thereof with respect to a surface of the metal base material.

Example 2

Figure 9A:
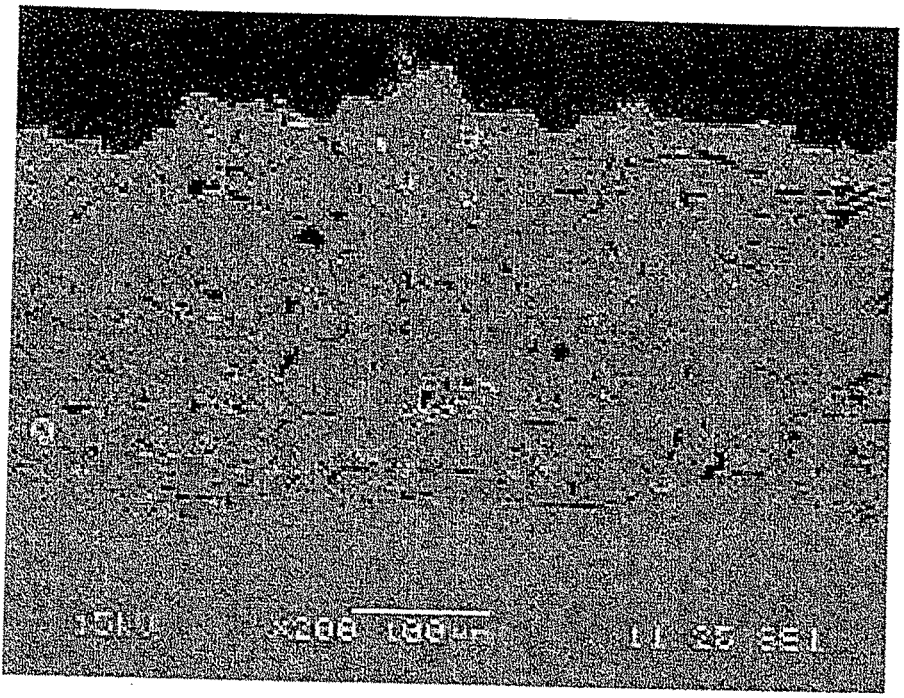
FIG. 9A is a diagram that shows a cross-sectional photograph of the heat radiation member according to Example 2 of the invention and a cross-sectional photograph of the heat radiation member before oxidation treatment.
Figure 9B:
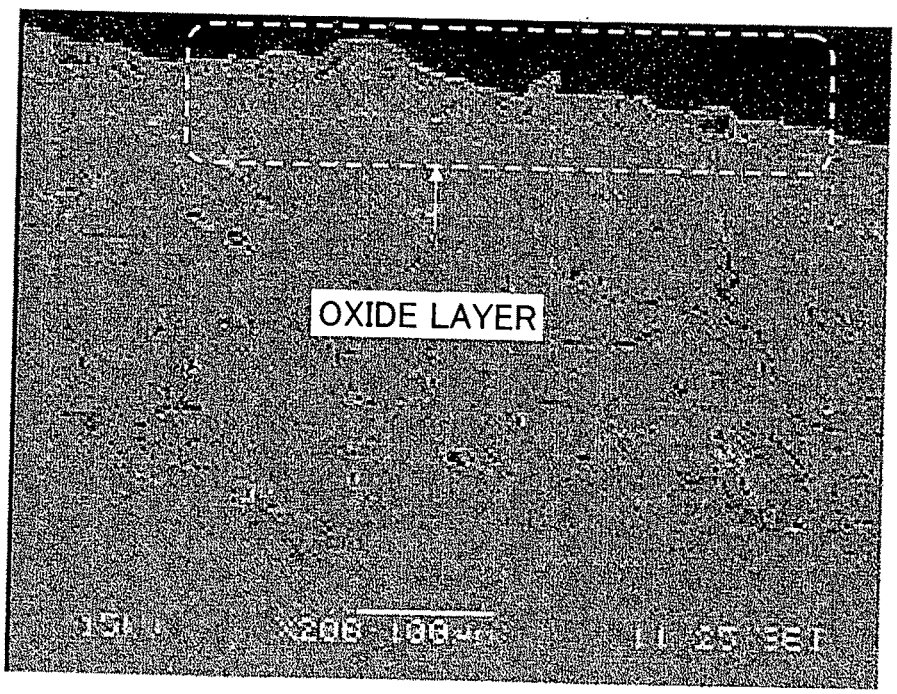
FIG. 9B is a diagram that shows a cross-sectional photograph of the heat radiation member according to Example 2 of the invention and a photograph of a cross-section of the heat radiation member after oxidation treatment.

According to the second manufacturing method described above, a heat radiation member was prepared. Specifically, on a metal base material (JIS Standard: SUS 444: 40 mm×40 mm, thickness: 2 mm) of which surface was roughened by shot blasting, a mesh (JIS Standard: SUS 304: ϕ 0.25×100× 100 mm, 30 mesh/inch) was fixed. Thereon, the ferromanganese particles used in example 1 shown in Table 2 were attached so that a film thickness was 100 μm by plasma spraying. Thereafter, the mesh was removed from the metal base material. Next, the plasma sprayed metal base material was heated for 1 hour under condition of air atmosphere and 800° C. to be oxidized, and an oxide layer was formed on a surface of the attached ferromanganese particle groups thereby. FIG. 9A and FIG. 9B are diagrams that show sectional photographs of the heat radiation members according to example 2, FIG. 9A being a sectional photograph of a heat radiation member before oxidizing treatment, and FIG. 9B being a sectional photograph of a heat radiation member after the oxidizing treatment.

In the same manner as example 1, in the heat radiation member according to example 2, a plurality of heat radiation sections made of ferromanganese and its oxide separately attached on a surface of the metal base material while dispersing on a surface of the metal base material. Further, on a surface of the heat radiation section, an oxide layer was formed as shown in FIG. 9B.

Example 3

According to the third manufacturing method described above, a heat radiation member was prepared. Specifically, a metal base material (JIS Standard: SUS 444: 40 mm×40 mm, thickness: 2 mm) of which surface was roughened by shot blasting was placed in an arc ion plating apparatus, and ferromanganese having the composition the same as example 1 was disposed. Then, under condition of vacuum in a chamber of $2 \times 10^{-3}$ Pa, base material temperature of 200° C. (heater temperature), current value of an arc power source of 150 A, and a bias voltage of 500 V, ferromanganese particles were attached so that ferromanganese particles (droplets) of the metal base material were dispersed.

Figure 10:
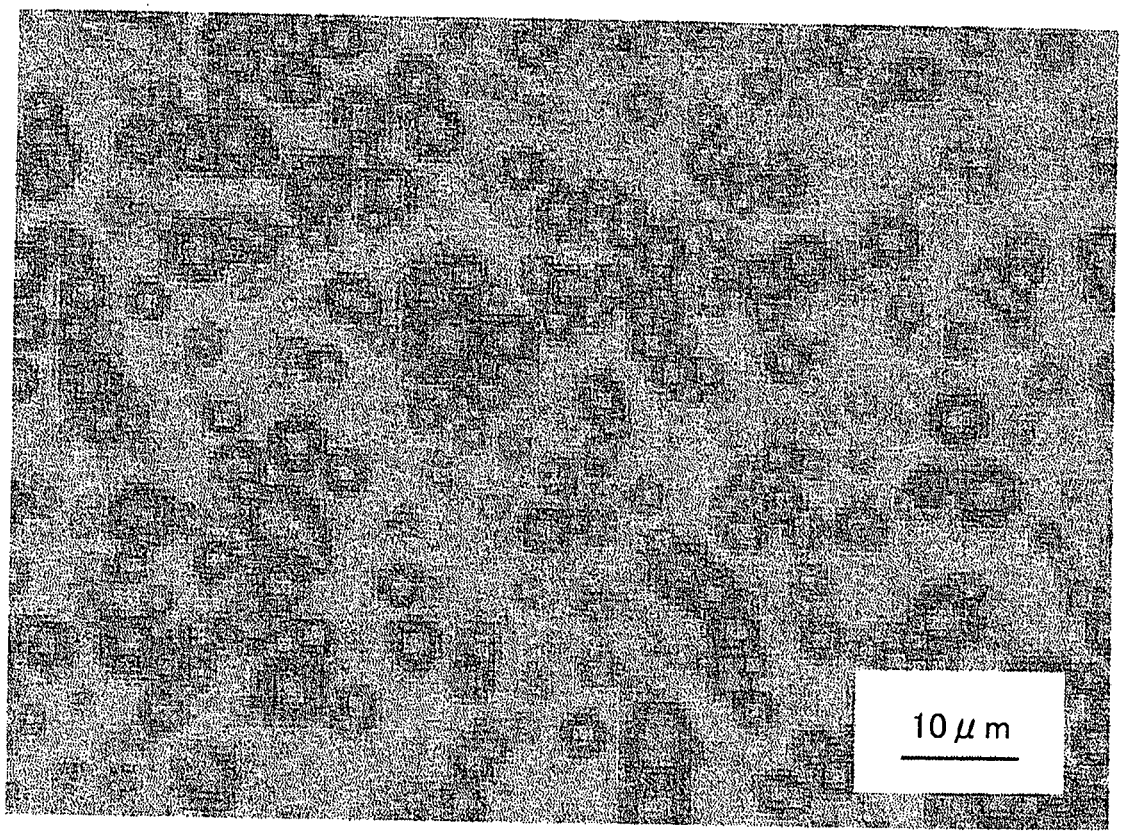
FIG. 10 is a photograph of a surface of the heat radiation section according to Example 3 of the invention.

In the same manner as example 2, a metal base material was heated for 1 hour under condition of air atmosphere and 800° C. to be oxidized, and an oxide layer was formed on a surface of attached ferromanganese particle groups. FIG. 10 is a photograph of a surface of a heat radiation member according to example 3. As shown in FIG. 10, in the same manner as example 1, on the heat radiation member according to example 3, a plurality of heat radiation sections made of ferromanganese and its oxide were separately attached on a surface of the metal base material while dispersing on a surface of the metal base material. Further, in a superficial layer of the heat radiation section, an oxide layer was formed.

In the above, although embodiments of the invention were described in detail, the invention is not limited to the embodiments, and without departing from the gist of the present invention recited in claims, various design modifications can be applied.

For example, in the embodiment, disc-like heat radiation sections are uniformly dispersed. However, as long as it can radiate heat (infrared radiation), a shape thereof is not particularly limited and may not be uniformly dispersed.

What is claimed is:
1. A method for manufacturing a heat radiation member comprising:
providing a metal base material made of a first metal material;
disposing a mesh on the metal base material so that the mesh is in contact with the metal base material;
after disposing the mesh on the metal base material, spraying metal particles made of a second metal material different from the first metal material to form heat radiation sections, including spraying metal particles to form a first heat radiation section and spraying metal particles to form a second heat radiation section on a surface of the metal base material on which the mesh is disposed, wherein the sprayed metal particles contained in the first heat radiation section are mainly made of a metal element that is different from a metal element of which the second heat radiation section is mainly made;

after forming the heat radiation sections, removing the mesh from the metal base material; and oxidizing the second metal material to form an oxide on the surface of the second metal material, wherein the first metal material is an aluminum-based material or stainless steel, and the second metal material contained in the first heat radiation section and the second metal material contained in the second heat radiation are selected from a group consisting of manganese, iron, chromium, copper, titanium, aluminum, silicon, calcium, and magnesium.

2. A method for manufacturing a heat radiation member, further comprising:

providing a metal base material made of a first metal material;

disposing a mesh on the metal base material so that the mesh is in contact with the metal base material;

after disposing the mesh on the metal base material, spraying metal particles made of a second metal material different from the first metal material and metal oxide particles made of the second metal material different from the first metal material to form heat radiation sections, including spraying metal particles and metal oxide particles to form a first heat radiation section and spraying metal particles and metal oxide particles to form a second heat radiation section on a surface of the metal base material on which the mesh is disposed, wherein the sprayed metal particles and metal oxide particles contained in the first heat radiation section are mainly made of a metal element that is different from a metal element of which the sprayed metal particles and metal oxide particles contained in the second heat radiation section is mainly made;

after forming the heat radiation sections, removing the mesh from the metal base material, wherein the first metal material is an aluminum-based material or stainless steel, and the second metal material contained in the first heat radiation section and the second metal material contained in the second heat radiation are selected from a group consisting of manganese, iron, chromium, copper, titanium, aluminum, silicon, calcium, and magnesium.

* * * * *